(12) United States Patent
Nihei

(10) Patent No.: US 12,136,604 B2
(45) Date of Patent: Nov. 5, 2024

(54) BONDING APPARATUS AND BONDING METHOD

(71) Applicant: SHINKAWA LTD., Tokyo (JP)

(72) Inventor: Hideharu Nihei, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 293 days.

(21) Appl. No.: 17/436,621

(22) PCT Filed: Dec. 21, 2020

(86) PCT No.: PCT/JP2020/047709
§ 371 (c)(1),
(2) Date: Sep. 6, 2021

(87) PCT Pub. No.: WO2022/137287
PCT Pub. Date: Jun. 30, 2022

(65) Prior Publication Data
US 2022/0406747 A1 Dec. 22, 2022

(51) Int. Cl.
*H01L 23/00* (2006.01)
*H01L 25/065* (2023.01)

(52) U.S. Cl.
CPC ............ *H01L 24/75* (2013.01); *H01L 24/32* (2013.01); *H01L 24/83* (2013.01);
(Continued)

(58) Field of Classification Search
CPC ............ H01L 24/32; H01L 24/83; H01L 2224/32221; H01L 2224/75753;
(Continued)

(56) References Cited

U.S. PATENT DOCUMENTS

| 2016/0079102 A1 | 3/2016 | Fukayama et al. |
| 2017/0005068 A1 | 1/2017 | Nishimura et al. |
| 2022/0045029 A1* | 2/2022 | Moon .................. H01L 24/741 |

FOREIGN PATENT DOCUMENTS

| JP | 5243284 | 7/2013 |
| JP | 2016062958 | 4/2016 |
| WO | 2015079991 | 6/2015 |

OTHER PUBLICATIONS

"International Search Report (Form PCT/ISA/210) of PCT/JP2020/047709," mailed on Mar. 23, 2021, with English translation thereof, pp. 1-3.

* cited by examiner

*Primary Examiner* — Jasmine J Clark
(74) *Attorney, Agent, or Firm* — JCIPRNET

(57) ABSTRACT

The present invention includes: a position detection unit (55) detecting positions of semiconductor chips and storing each detected position in a position database (56); a position correction unit (57) outputting a corrected bonding position; and a bonding control unit (58) performing bonding of the semiconductor chips based on the corrected bonding position input from the position correction unit (57). The position correction unit (57) calculates position shift amounts between the semiconductor chips of respective stages and an accumulated position shift amount, and when the accumulated position shift amount is greater than or equal to a predetermined threshold value, corrects the position of the semiconductor chip by the accumulated position shift amount and outputs it as the corrected bonding position, and the bonding control unit (58) performs bonding of the semiconductor chip of the next stage at the corrected bonding position input from the position correction unit.

12 Claims, 13 Drawing Sheets

(52) U.S. Cl.
CPC ............... *H01L 25/0657* (2013.01); *H01L 2224/32145* (2013.01); *H01L 2224/32221* (2013.01); *H01L 2224/7517* (2013.01); *H01L 2224/75753* (2013.01); *H01L 2224/75756* (2013.01); *H01L 2224/75824* (2013.01); *H01L 2224/75841* (2013.01); *H01L 2224/75901* (2013.01); *H01L 2224/83123* (2013.01); *H01L 2224/83129* (2013.01); *H01L 2224/8313* (2013.01); *H01L 2224/8318* (2013.01); *H01L 2224/83908* (2013.01); *H01L 2225/06524* (2013.01); *H01L 2225/06562* (2013.01); *H01L 2225/06593* (2013.01)

(58) Field of Classification Search
CPC . H01L 2224/08145; H01L 2224/75251; H01L 2224/75702; H01L 2224/8013; H01L 2224/80132; H01L 2224/8113; H01L 2224/75745; H01L 25/50
USPC ....................................................... 438/455
See application file for complete search history.

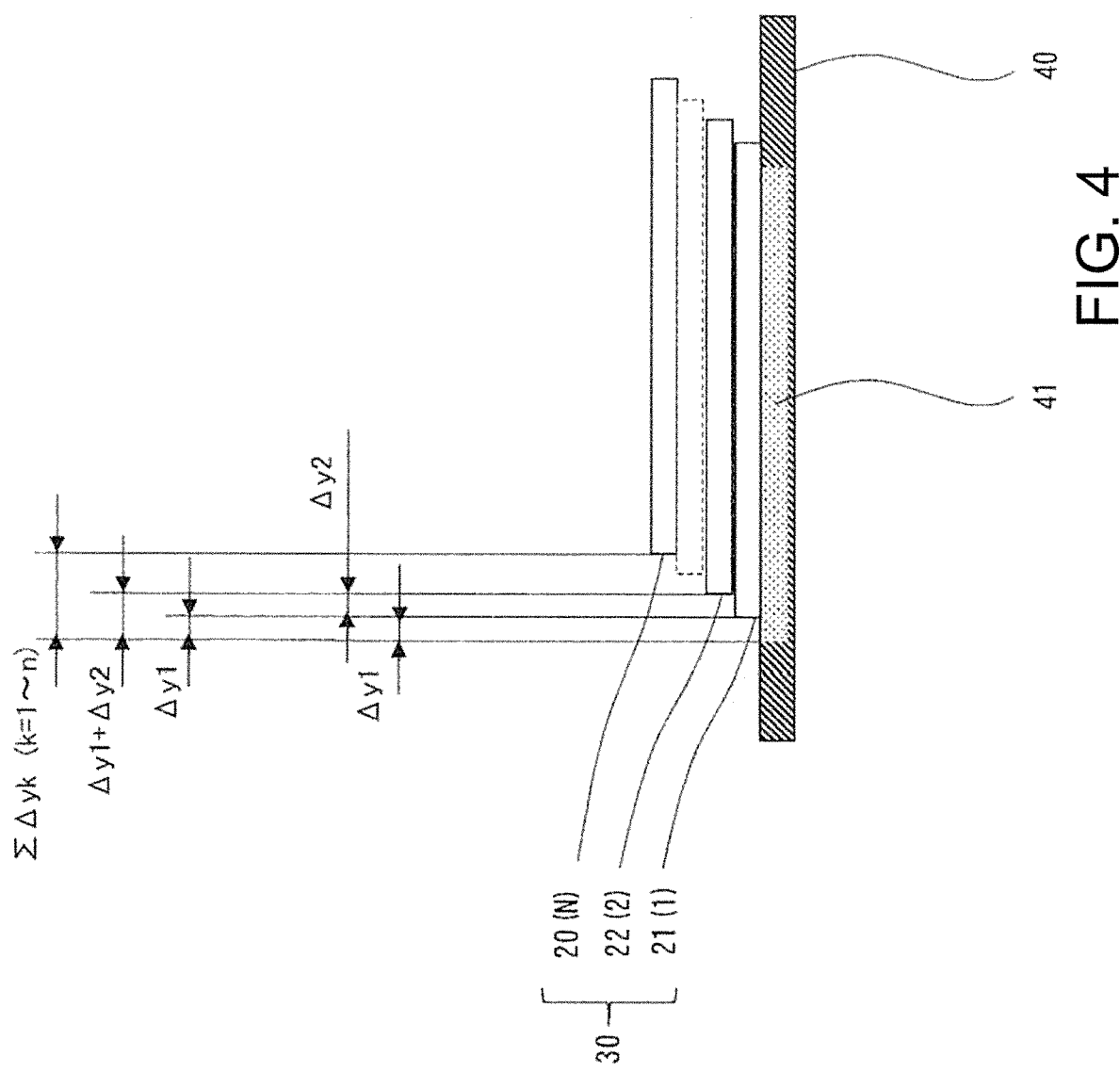

Position database

Island number: 1

| Stage number | Island or semiconductor chip position | Position shift amount | Accumulated position shift amount |
|---|---|---|---|
| 0 | $(x0, y0)$ | | |
| 1 | $(x1, y1)$ | $(\Delta x1, \Delta y1)$ | $(\Delta x1, \Delta y1)$ |
| 2 | $(x2, y2)$ | $(\Delta x2, \Delta y2)$ | $(\Delta x1+\Delta x2, \Delta y1+\Delta y2)$ |
| 3 | $(x3, y3)$ | $(\Delta x3, \Delta y3)$ | $\left(\sum_{K=1}^{3} \Delta X_K, \sum_{K=1}^{3} \Delta y_K\right)$ |
| .. | ... | ... | ... |
| N−1 | $(xN-1, yN-1)$ | $(\Delta xN-1, \Delta yN-1)$ | $\left(\sum_{K=1}^{N-1} \Delta X_K, \sum_{K=1}^{N-1} \Delta y_K\right)$ |
| N | $(xN, yN)$ | $(\Delta xN, \Delta yN)$ | $\left(\sum_{K=1}^{N} \Delta X_K, \sum_{K=1}^{N} \Delta y_K\right)$ |
| N+1 | $(xN+1, yN+1)$ | $(\Delta xN+1, \Delta yN+1)$ | $\left(\sum_{K=1}^{N+1} \Delta X_K, \sum_{K=1}^{N+1} \Delta y_K\right)$ |

Island number: 2

| Stage number | Island or semiconductor chip position | Position shift amount | Accumulated position shift amount |
|---|---|---|---|
| 0 | $(x0, y0)$ | | |
| 1 | $(x1, y1)$ | $(\Delta x1, \Delta y1)$ | $(\Delta x1, \Delta y1)$ |
| 2 | $(x2, y2)$ | $(\Delta x2, \Delta y2)$ | $(\Delta x1+\Delta x2, \Delta y1+\Delta y2)$ |
| 3 | $(x3, y3)$ | $(\Delta x3, \Delta y3)$ | $\left(\sum_{K=1}^{3} \Delta X_K, \sum_{K=1}^{3} \Delta y_K\right)$ |
| .. | ... | ... | ... |

FIG. 5

BONDING APPARATUS AND BONDING METHOD

CROSS-REFERENCE TO RELATED APPLICATION

This application is a 371 application of the International PCT application serial no. PCT/JP2020/047709, filed on Dec. 21, 2020. The entirety of the above-mentioned patent application is hereby incorporated by reference herein and made a part of this specification.

BACKGROUND

Technical Field

The present invention relates to a structure of a bonding apparatus for laminating and bonding semiconductor chips, and a bonding method using the bonding apparatus.

Description of Related Art

A laminated semiconductor device in which a plurality of semiconductor chips are laminated and bonded has been put to use. When the semiconductor chips are laminated and bonded, a method may be used, which bonds the semiconductor chips by using a position detection mark provided on the surfaces of the semiconductor chips. For example, in some cases, a method may be used, which detects the position of the mark of the semiconductor chip after bonding, and adjusts the bonding position so that the position of the mark of the semiconductor chip to be bonded next matches the position of the mark of the semiconductor chip bonded previously (for example, see Patent Document 1).

RELATED ART

Patent Document

[Patent Document 1] Japanese Patent No. 5243284

SUMMARY

Problems to be Solved

However, when bonding is performed by matching the position of the mark of the semiconductor chip to be bonded next with the position of the mark of the semiconductor chip bonded previously, as described above, due to errors or the like of the bonding apparatus, the semiconductor chips may be laminated and bonded in a state of continuously shifting laterally in one direction, which causes the laminated semiconductor device to tilt.

Therefore, the present invention is to prevent the semiconductor chips from continuously shifting laterally in one direction during lamination and bonding.

Means for Solving the Problems

A bonding apparatus of the present invention is provided for laminating and bonding a plurality of semiconductor chips respectively onto a plurality of bonding regions of a base member. The bonding apparatus includes: a position detection unit detecting each position of each of the bonding regions of the base member and each position of the semiconductor chip of each stage laminated and bonded onto each of the bonding regions of the base member, and storing data of each position detected in a position database for each of the bonding regions of the base member; a position correction unit correcting a bonding position with reference to the position database, and outputting a corrected bonding position; and a bonding control unit performing bonding of the semiconductor chip based on the corrected bonding position input from the position correction unit. The position correction unit: calculates a position shift amount between the position of each of the bonding regions of the base member and the position of the semiconductor chip bonded thereon, or a position shift amount between the position of the semiconductor chip bonded and the position of the semiconductor chip bonded directly thereon each time the semiconductor chip of each stage is bonded, and stores each position shift amount calculated in the position database for each of the bonding regions of the base member, accumulates the position shift amounts from the base member to the semiconductor chip of the stage bonded when laminating and bonding the semiconductor chips, and calculates an accumulated position shift amount, and corrects each position of each semiconductor chip of the stage bonded immediately before being detected by the position detection unit by the accumulated position shift amount when the accumulated position shift amount is greater than or equal to a predetermined threshold value, and outputs the position corrected as the corrected bonding position. The bonding control unit performs bonding of the semiconductor chip of a next stage at the corrected bonding position input from the position correction unit.

As described above, the position shift amount of each stage is stored in the position database during lamination and bonding to calculate the accumulated position shift amount, and when the accumulated position shift amount is greater than the predetermined threshold value, the bonding position is corrected by the accumulated position shift amount. Therefore, the semiconductor chips can be prevented from continuously shifting laterally in one direction during lamination and bonding.

In the bonding apparatus of the present invention, the position correction unit may correct each position of each semiconductor chip of the stage bonded immediately before being detected by the position detection unit by each position shift amount of the stage when the accumulated position shift amount is less than the predetermined threshold value, and output the position corrected as the bonding position of the next stage.

As described above, when the accumulated position shift amount is less than the predetermined threshold value, after the bonding of each stage, the bonding position is corrected by the position shift amount of the semiconductor chip of each stage to perform the bonding of the next stage. Therefore, the shift amount of the bonding of each stage can be suppressed.

In the bonding apparatus of the present invention, the position correction unit may output a stop command for stopping a bonding operation to the bonding control unit when the accumulated position shift amount is greater than or equal to a predetermined stop threshold value, and the bonding control unit may stop the bonding operation when the stop command is input from the position correction unit.

As described above, abnormal tilt during lamination and bonding can be detected to stop the bonding apparatus.

In the bonding apparatus of the present invention, when bonding is stopped in a state of laminating and bonding to an intermediate stage and the base member is taken out, and then the base member is set again, the position correction unit may accumulate each position shift amount from the base material to the semiconductor chip of the intermediate stage with reference to the position database, and calculate an intermediate accumulated position shift amount, and correct each position of the semiconductor chip of the stage bonded immediately before bonding is stopped by the intermediate accumulated position shift amount calculated, and output the position corrected as the corrected bonding position.

Thus, when the bonding is stopped, the substrate is temporarily taken out from the bonding apparatus, and the bonding is restarted after the substrate is set again in the bonding apparatus, the semiconductor chip can be bonded to the vicinity of the reference position of the substrate, and even if the substrate is taken out and reset in the middle of bonding, the lateral shift amount of the semiconductor chip can be suppressed.

In the bonding apparatus of the present invention, a plurality of dummy chips may be respectively laminated and bonded onto each of the bonding regions of the base material. The position detection unit may detect each position of each of the bonding regions of the base member and each position of the dummy chip of each stage laminated and bonded onto each of the bonding regions of the base member, and store data of each position detected in the position database for each of the bonding regions of the base member. The position correction unit may calculate a position shift amount between the position of each of the bonding regions of the base member and the position of the dummy chip bonded thereon, or a position shift amount between the position of the dummy chip bonded and the position of the dummy chip bonded directly thereon, and store each position shift amount calculated in the position database for each of the bonding regions of the base member, and correct a bonding position of each stage when the semiconductor chip is laminated and bonded based on the position database.

As described above, the bonding is performed by using the dummy chips in advance and the position shift amounts of the dummy chips from the lowermost stage to the uppermost stage are stored in the database, and the bonding position is adjusted with reference to the database. Therefore, the position shift amount of the semiconductor chip of each stage during lamination and bonding can be suppressed.

A bonding method of the present invention is provided for laminating and bonding a plurality of semiconductor chips respectively onto a plurality of bonding regions of a base member. The bonding method includes: a position detection step of detecting each position of each of the bonding regions of the base member and each position of the semiconductor chip of each stage laminated and bonded onto each of the bonding regions of the base member, and storing data of each position detected in a position database for each of the bonding regions of the base member; a position shift amount calculation step of calculating a position shift amount between the position of each of the bonding regions of the base member and the position of the semiconductor chip bonded thereon, or a position shift amount between the position of the semiconductor chip bonded and the position of the semiconductor chip bonded directly thereon each time the semiconductor chip of each stage is bonded, and storing each position shift amount calculated in the position database for each of the bonding regions of the base member; an accumulated position shift amount calculation step of accumulating the position shift amounts from the base member to the semiconductor chip of the stage bonded when laminating and bonding the semiconductor chips, and calculating an accumulated position shift amount; a position correction step of correcting each position of each semiconductor chip of the stage bonded immediately before being detected in the position detection step by the accumulated position shift amount when the accumulated position shift amount is greater than or equal to a predetermined threshold value, and using the position corrected as a bonding position of a next stage; and a bonding step of laminating and bonding the semiconductor chip of the next stage at a corrected bonding position.

In the bonding method of the present invention, the position correction step may correct each position of each semiconductor chip of the stage bonded immediately before being detected in the position detection step by each position shift amount of the stage calculated in the position shift amount calculation step when the accumulated position shift amount is less than the predetermined threshold value, and use the position corrected as the bonding position of the next stage.

The bonding method of the present invention may include a bonding stop step of stopping a bonding operation when the accumulated position shift amount is greater than or equal to a predetermined stop threshold value.

Effects

The present invention can prevent the semiconductor chips from continuously shifting laterally in one direction during lamination and bonding.

BRIEF DESCRIPTION OF THE DRAWINGS

FIG. 4 is an elevation view showing the position shift of a semiconductor chip of each stage in a lateral direction when the semiconductor chips are laminated and bonded by the bonding apparatus shown in FIG. 1.

FIG. 5 is a diagram showing a database structure of a position database stored in a storage unit of the bonding apparatus shown in FIG. 1.

DESCRIPTION OF THE EMBODIMENTS

Figure 1:
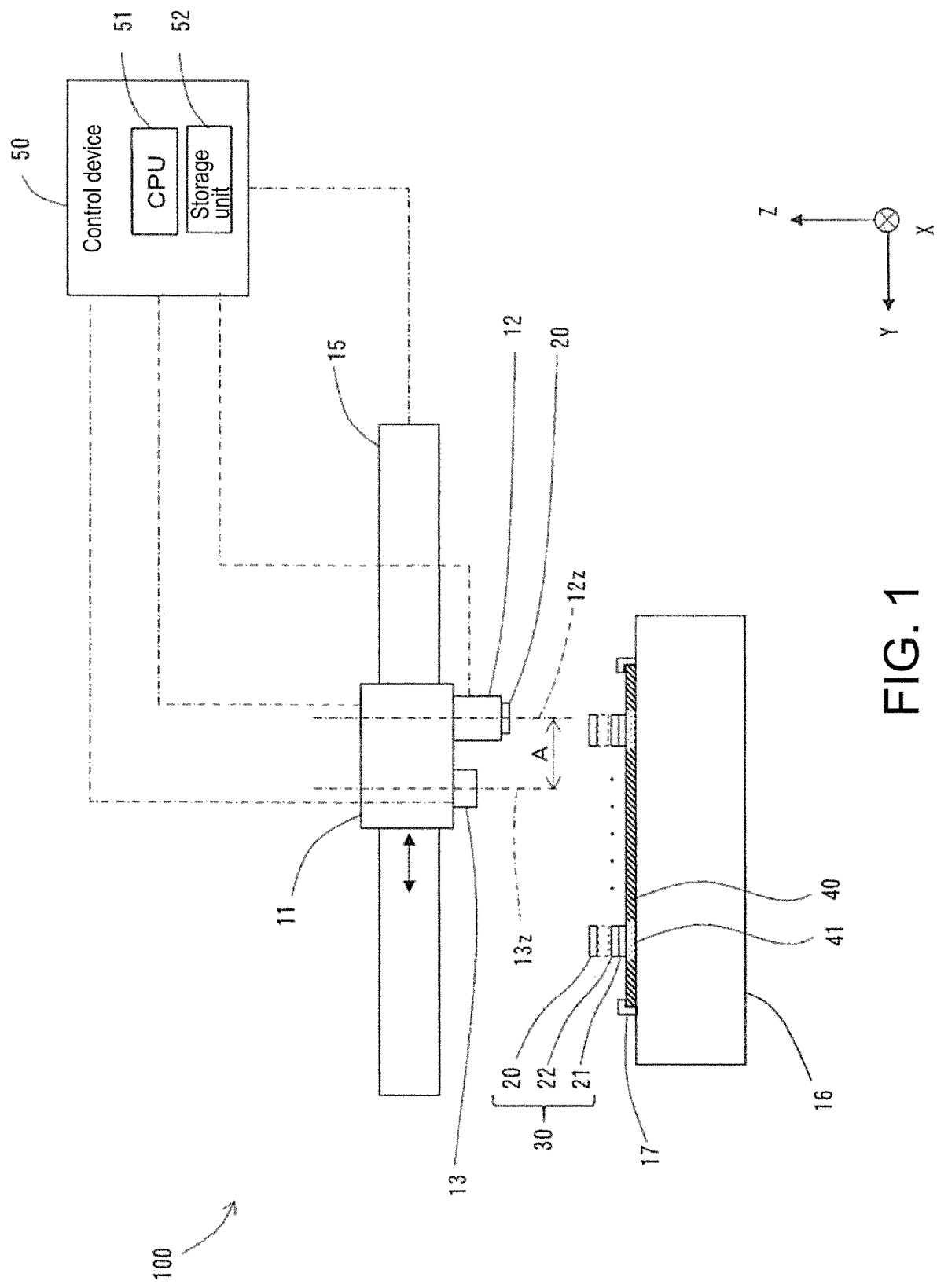
FIG. 1 is a system diagram showing a configuration of a bonding apparatus of an embodiment.
Figure 2:
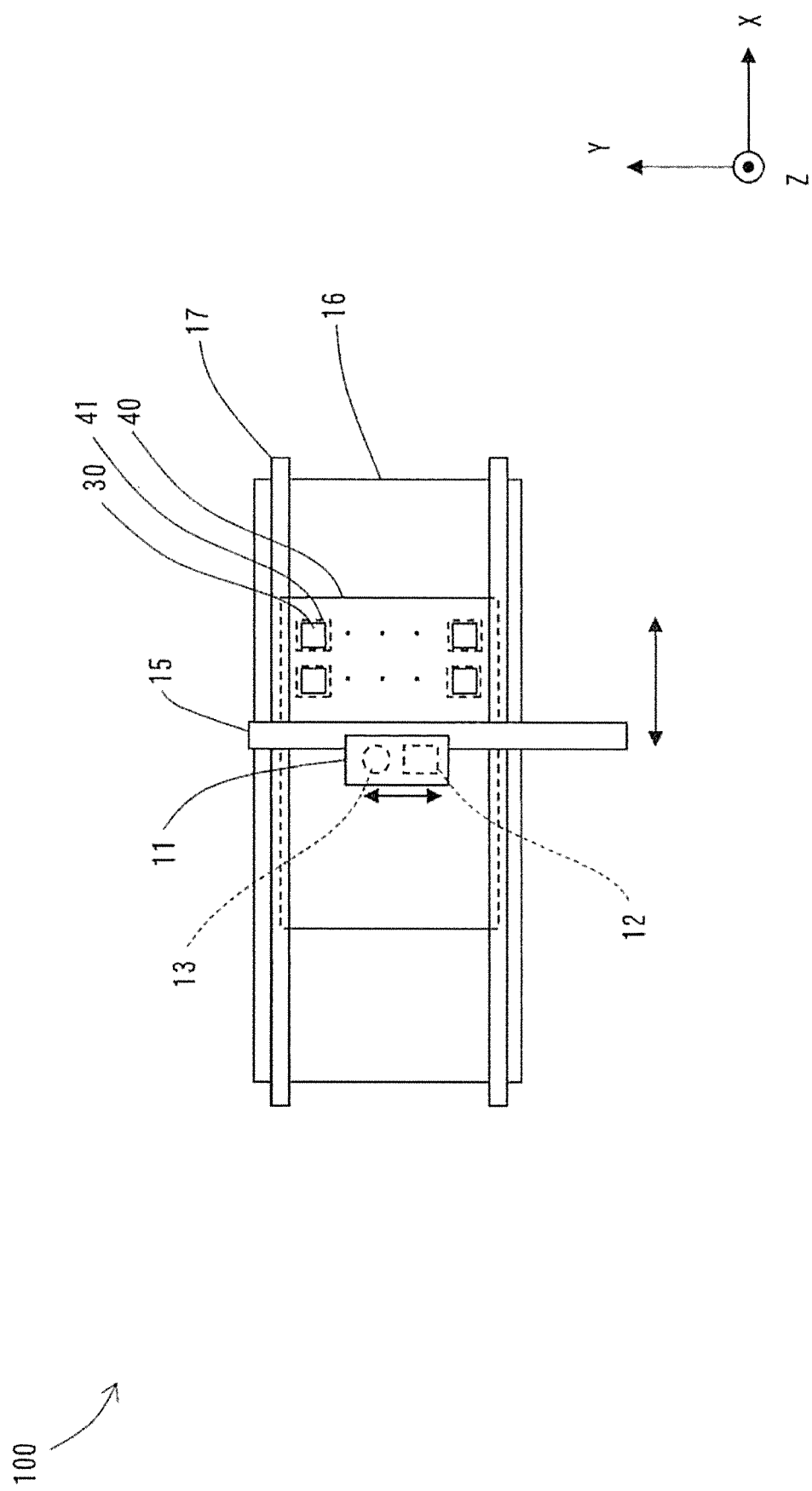
FIG. 2 is a plan view of the bonding apparatus shown in FIG. 1.

Hereinafter, a bonding apparatus 100 according to an embodiment will be described with reference to the drawings. As shown in FIG. 1 and FIG. 2, the bonding apparatus 100 includes a bonding stage 16, a gantry rail 15, a bonding head 11, a bonding nozzle 12, a camera 13, and a control device 50.

The bonding apparatus 100 laminates and bonds a plurality of semiconductor chips 20 onto a plurality of islands 41 of a substrate 40. In the following description, when the laminated stages of the lamination and bonding are distinguished from each other, the semiconductor chip of the first stage and the semiconductor chip of the second stage are respectively referred to as semiconductor chips 21 and 22, and the semiconductor chip of the $N^{th}$ stage is referred to as semiconductor chip 20(N). In addition, when the laminated stages are not distinguished from each other, the semiconductor chips are referred to as semiconductor chips 20.

The bonding stage 16 guides the substrate 40 which is a base member from both sides with two guide rails 17 provided on the upper surface, and sucks and fixes the substrate 40 to the upper surface. In addition, a heater for heating the substrate 40 is mounted inside the bonding stage 16. The substrate 40 is guided by the guide rails 17 to be transported in an X direction. In the following description, the transport direction of the substrate 40 is described as the X direction, a direction at a right angle to the X direction on a horizontal plane is described as a Y direction, and a vertical direction is described as a Z direction.

The gantry rail 15 is provided above the bonding stage 16 to move in the X direction. The bonding head 11 is guided by the gantry rail 15 to move in the Y direction. Accordingly, the bonding head 11 can move in the XY directions with respect to the substrate 40 sucked and fixed onto the bonding stage 16.

The bonding nozzle 12 is mounted on the bonding head 11 to move in the Y direction together with the bonding head 11. In addition, the bonding nozzle 12 includes a collet for sucking and holding the semiconductor chip 20 at the lower end, and can move in the Z direction. The bonding nozzle 12 moves in the Z direction and bonds the semiconductor chip 20 sucked and fixed to the tip onto the island 41, which is a bonding region of the substrate 40, or onto the semiconductor chip 20 that has been bonded onto the island 41.

The camera 13 is mounted on the bonding head 11 to move in the Y direction together with the bonding nozzle 12 and take an image of the island 41 of the substrate 40 or the semiconductor chip 20 bonded onto the island 41. An optical axis 13z of the camera 13 and a Z-direction centerline 12z of the bonding nozzle 12 are separated by an offset A in the Y direction.

The bonding head 11, the gantry rail 15, and the bonding nozzle 12 are connected to the control device 50 and operate according to a command of the control device 50. The camera 13 is connected to the control device 50, and the image data taken by the camera 13 is input to the control device 50. The control device 50 is a computer that includes therein a CPU 51 which is a processor for performing information processing, and a storage unit 52 for storing operating programs, operating data or the like.

Figure 3:
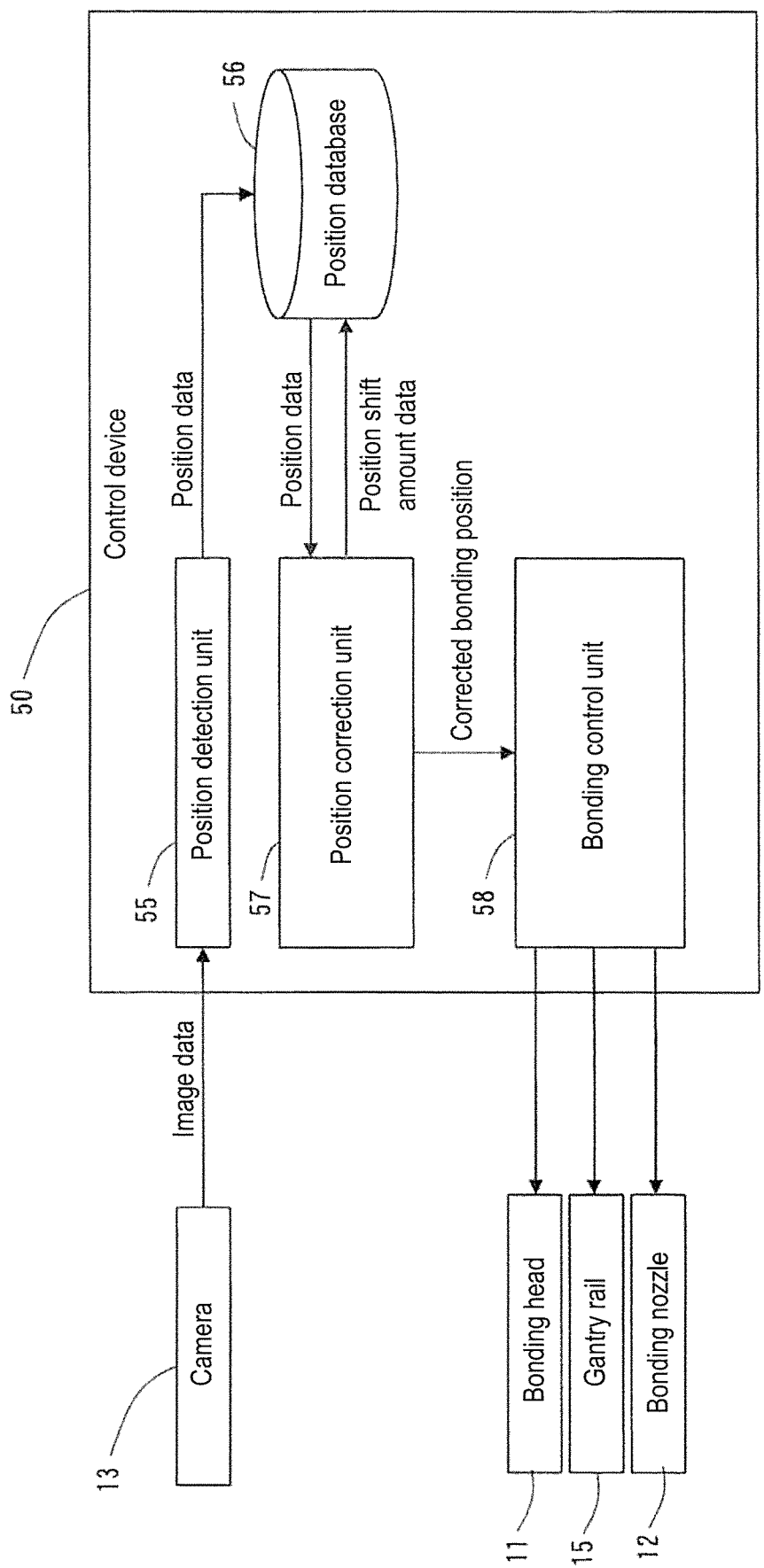
FIG. 3 is a functional block diagram of a control device of the bonding apparatus shown in FIG. 1.

As shown in FIG. 3, the control device 50 includes four functional blocks which are a position detection unit 55, a position database 56, a position correction unit 57, and a bonding control unit 58. The position detection unit 55, the position correction unit 57, and the bonding control unit 58 are realized by the CPU 51 executing the operating programs stored in the storage unit 52. Further, the position database 56 is realized by the storage unit 52.

The position detection unit 55 detects the position of the island 41 based on the image of the island 41 of the substrate 40 taken by the camera 13. In addition, the position detection unit 55 detects each position of the semiconductor chip 20 of each stage laminated and bonded onto the island 41 of the substrate 40 based on the image of the semiconductor chip 20 of each stage bonded onto the island 41. The position detection unit 55 stores each detected position in the position database 56 described later.

The position correction unit 57 corrects the bonding position with reference to the position database 56 and outputs the corrected bonding position to the bonding control unit 58.

The bonding control unit 58 bonds the semiconductor chip 20 at the corrected bonding position input from the position correction unit 57.

Next, a configuration of the position database 56 will be described with reference to FIG. 4 and FIG. 5. When the bonding apparatus 100 laminates and bonds the plurality of semiconductor chips 20 onto the plurality of islands 41 of the substrate 40, as shown in FIG. 1, the semiconductor chips 20 are laminated in the Z direction to form a laminated semiconductor device 30. When the semiconductor chips 20 are laminated correctly, the laminated semiconductor device 30 is laminated vertically upward with respect to the substrate 40.

However, due to manufacturing errors of each part of the bonding apparatus 100 or thermal deformation of the bonding apparatus 100, the bonding position of the semiconductor chip 20 may shift in the lateral direction as in the example shown in FIG. 4. In FIG. 4, the semiconductor chip 21 of the first stage shifts to the Y-direction minus side by $\Delta y1$ with respect to the island 41 of the substrate 40 and is bonded onto the island 41. Similarly, the semiconductor chip 22 of the second stage shifts to the Y-direction minus side by $\Delta y2$ with respect to the semiconductor chip 21 of the first stage and is bonded. Similarly, afterward, the semiconductor chip 20(N) of the $N^{th}$ stage shifts to the Y-direction minus side by $\Delta yN$ with respect to the semiconductor chip 20(N−1) of the N−1$^{th}$ stage and is bonded. When the positions of the semiconductor chips 20 are shifted and bonded in this manner, the accumulated position shift amount from the island 41 to the first stage is $\Delta y1$, the accumulated position shift amount to the second stage is $\Delta y1+\Delta y2$, and the accumulated position shift amount to the $N^{th}$ stage is $$\sum_{K=1}^{N} \Delta y_K.$$ [Numerical formula 1]

As shown in FIG. 5, the position database 56 stores each position of the island 41 of the substrate 40 and each position of the semiconductor chip 20 of each stage laminated and bonded, the position shift amount of each stage, and the accumulated position shift amount of each stage for each island 41 of the substrate 40.

In FIG. 5, (x0, y0) represents the XY coordinate position of the center of the island 41 calculated by the position detection unit 55 based on the image of the island 41 of the substrate 40 taken by the camera 13. In addition, (x1, y1) represents the XY coordinate position of the center of the semiconductor chip 21 calculated by the position detection unit 55 based on the image of the semiconductor chip 21 of the first stage taken by the camera 13. Similarly, (xN, yN) represents the XY coordinate position of the center of the semiconductor chip 20(N) calculated by the position detection unit 55 based on the image of the semiconductor chip 20(N) of the $N^{th}$ stage taken by the camera 13.

In addition, ($\Delta$x1, $\Delta$y1) represents the position shift amount between the center coordinates (x0, y0) of the island 41 of the substrate 40 and the center coordinates (x1, y1) of the semiconductor chip 21 of the first stage calculated by the position correction unit 57. Here, $\Delta$x1=x1−x0, and $\Delta$y1=y1−y0. Similarly, ($\Delta$xN, $\Delta$yN) represents the position shift amount between the center coordinates of the semiconductor chip 20(N) of the $N^{th}$ stage and the center coordinates of the semiconductor chip 20(N−1) of the N−$1^{th}$ stage, wherein $\Delta$xN=x(N)−x(N−1), and $\Delta$yN=y(N)−y(N−1).

Furthermore, the accumulated position shift amount is obtained by accumulating the position shift amounts of the center positions of the semiconductor chips 20 from the island 41 to the $N^{th}$ stage. The accumulated position shift amount of the semiconductor chip 21 of the first stage is the same as the position shift amount ($\Delta$x1, $\Delta$y1) between the center coordinates (x0, y0) of the island 41 and the center coordinates (x1, y1) of the semiconductor chip 21 of the first stage. The accumulated position shift amount of N stages above the second stage is the accumulated value of the position shift amounts up to the $N^{th}$ stage, and $$\left(\sum_{K=1}^{N}\Delta x_K, \sum_{K=1}^{N}\Delta y_K\right).$$ [Numerical formula 2]

Next, the operation of the bonding apparatus 100 according to the embodiment will be described with reference to FIG. 6 to FIG. 11. In step S101 of FIG. 6, as shown in FIG. 8, the bonding control unit 58 operates the bonding head 11 and the gantry rail 15 to move the bonding head 11 in the XY directions so that the center of a visual field 60 of the camera 13 matches the center of the island 41 of the substrate 40. As shown in FIG. 8, if the center of the island 41 is positioned at the center of the visual field 60 of the camera 13, the position detection unit 55 receives the image of the island 41 taken by the camera 13. Then, the position detection unit 55 analyzes the image to detect the positions of marks 42 and 43, and detects a centerline 41x in the X direction and a centerline 41y in the Y direction from the positions of the two marks 42 and 43 to calculate the XY coordinates (x0, y0) of the center position 45 of the island 41 as the intersection of the two centerlines 41x and 41y. Then, the position detection unit 55 stores the calculated XY coordinates (x0, y0) in the position database 56 as shown in FIG. 5.

In this case, since the position shift amount is calculated, the position correction unit 57 outputs the XY coordinates (x0, y0) of the center position 45 of the island 41 stored in the position database 56 as the corrected bonding position of the semiconductor chip 21 of the first stage to the bonding control unit 58.

Figure 6:
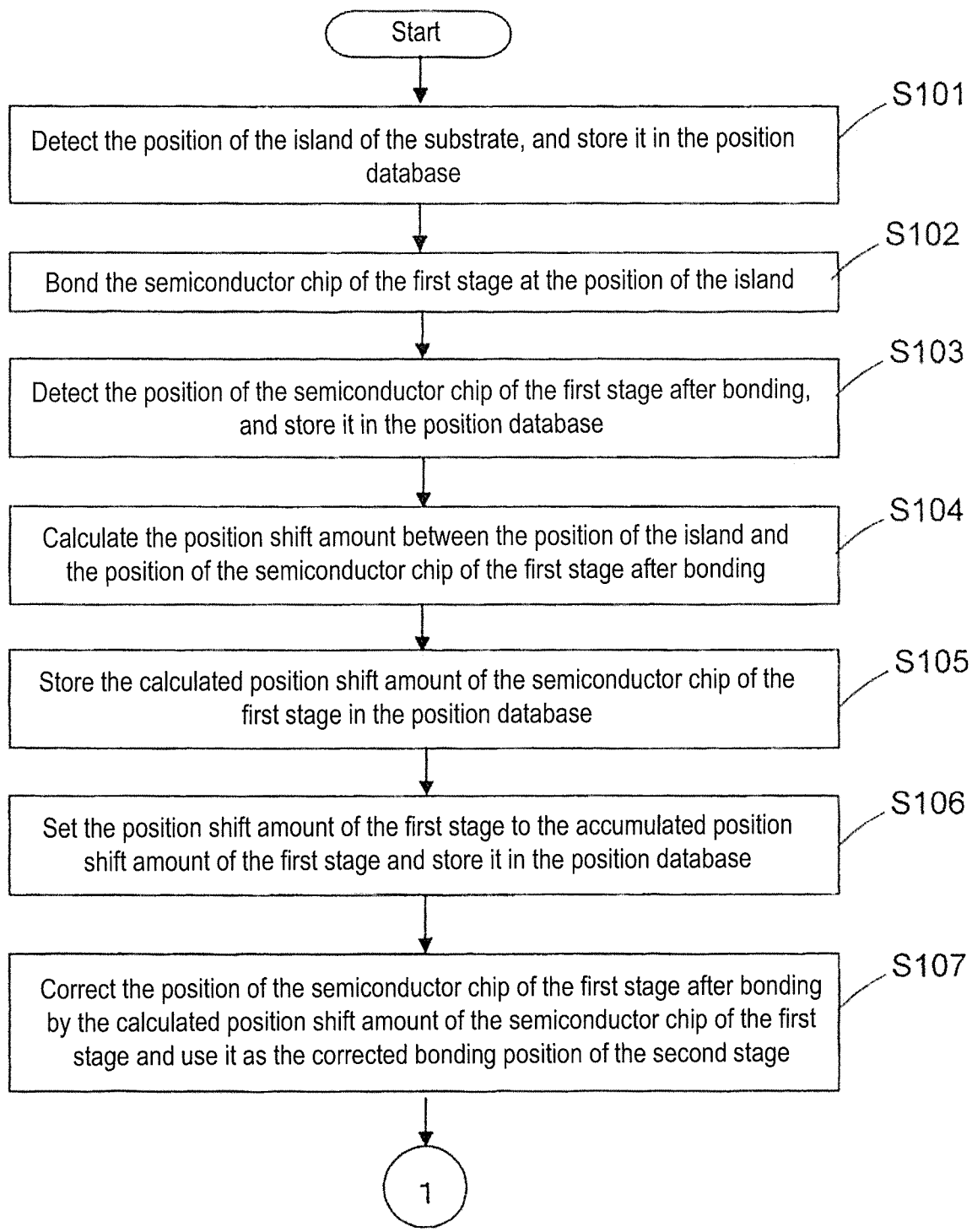
FIG. 6 is a flowchart showing an operation of the bonding apparatus shown in FIG. 1.

In step S102 of FIG. 6, the bonding control unit 58 moves the bonding head 11 in the Y direction by the offset A so that the Z-direction centerline 12z of the bonding nozzle 12 comes to the XY coordinates (x0, y0). The semiconductor chip 20 is sucked and fixed to the tip of the bonding nozzle 12 so that the center coordinates XY become the position of the Z-direction centerline 12z. Accordingly, when the Z-direction centerline 12z of the bonding nozzle 12 is aligned with the XY coordinates (x0, y0), the center position 215 of the semiconductor chip 21 becomes the same XY position as the center position 45 of the island 41. Then, the bonding control unit 58 lowers the bonding nozzle 12 to bond the semiconductor chip 21 of the first stage onto the island 41.

Figure 9:
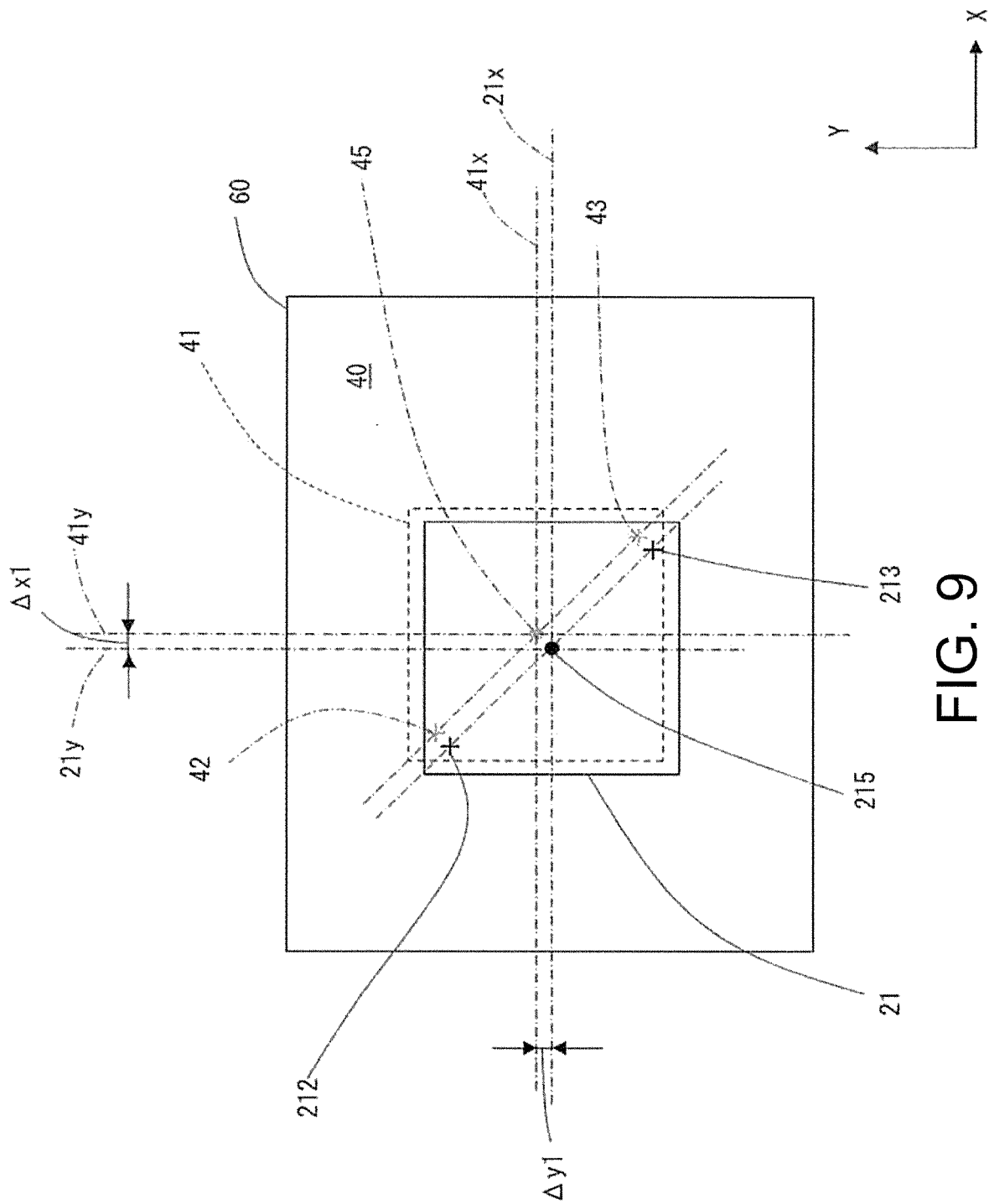
FIG. 9 is an image of a state where the semiconductor chip of the first stage is bonded onto the island shown in FIG. 8, taken by the camera.

In step S103 of FIG. 6, the bonding control unit 58 moves the bonding head 11 to the Y-direction minus side by the offset A so that the center of the visual field 60 of the camera 13 matches the center of the semiconductor chip 21. The position detection unit 55 receives the image in which the semiconductor chip 21 of the first stage bonded enters the visual field 60 as shown in FIG. 9 from the camera 13. Then, the position detection unit 55 analyzes the image to detect the positions of the marks 212 and 213 of the semiconductor chip 21 of the first stage, and detects the centerline 21x in the X direction and the centerline 21y in the Y direction from the positions of the two marks 212 and 213 to calculate the XY coordinates (x1, y1) of the center position 215 of the semiconductor chip 21 as the intersection of the two centerlines 21x and 21y. Then, the position detection unit 55 stores the calculated XY coordinates (x1, y1) in the position database 56 as shown in FIG. 5.

In step S104 of FIG. 6, the position correction unit 57 calculates the position shift amount ($\Delta$x1, $\Delta$y1) between the XY coordinates (x0, y0) of the center position 45 of the island 41 and the XY coordinates (x1, y1) of the center position 215 of the semiconductor chip 21 of the first stage bonded onto the island 41 stored in the position database 56. Then, in step S105 of FIG. 6, the position correction unit 57 stores the calculated position shift amount ($\Delta$x1, $\Delta$y 1) in the position database 56 as shown in FIG. 5. Here, ($\Delta$x1, $\Delta$y1) is the position shift amount of the semiconductor chip 21 of the first stage, and $\Delta$x1=x1−x0, and $\Delta$y1=y1−y0.

In step S106 of FIG. 6, the position correction unit 57 sets the calculated position shift amount of the semiconductor chip 21 of the first stage as the accumulated position shift amount of the first stage, and stores it in the position database 56 as shown in FIG. 5.

In step S107 of FIG. 6, the position correction unit 57 corrects the XY coordinates (x1, y1) of the center position 215 of the semiconductor chip 21 of the first stage by the position shift amount ($\Delta$x1, $\Delta$y1) of the semiconductor chip 21 of the first stage, and outputs it as the bonding position of the semiconductor chip 22 of the second stage to the bonding control unit 58.

Figure 7:
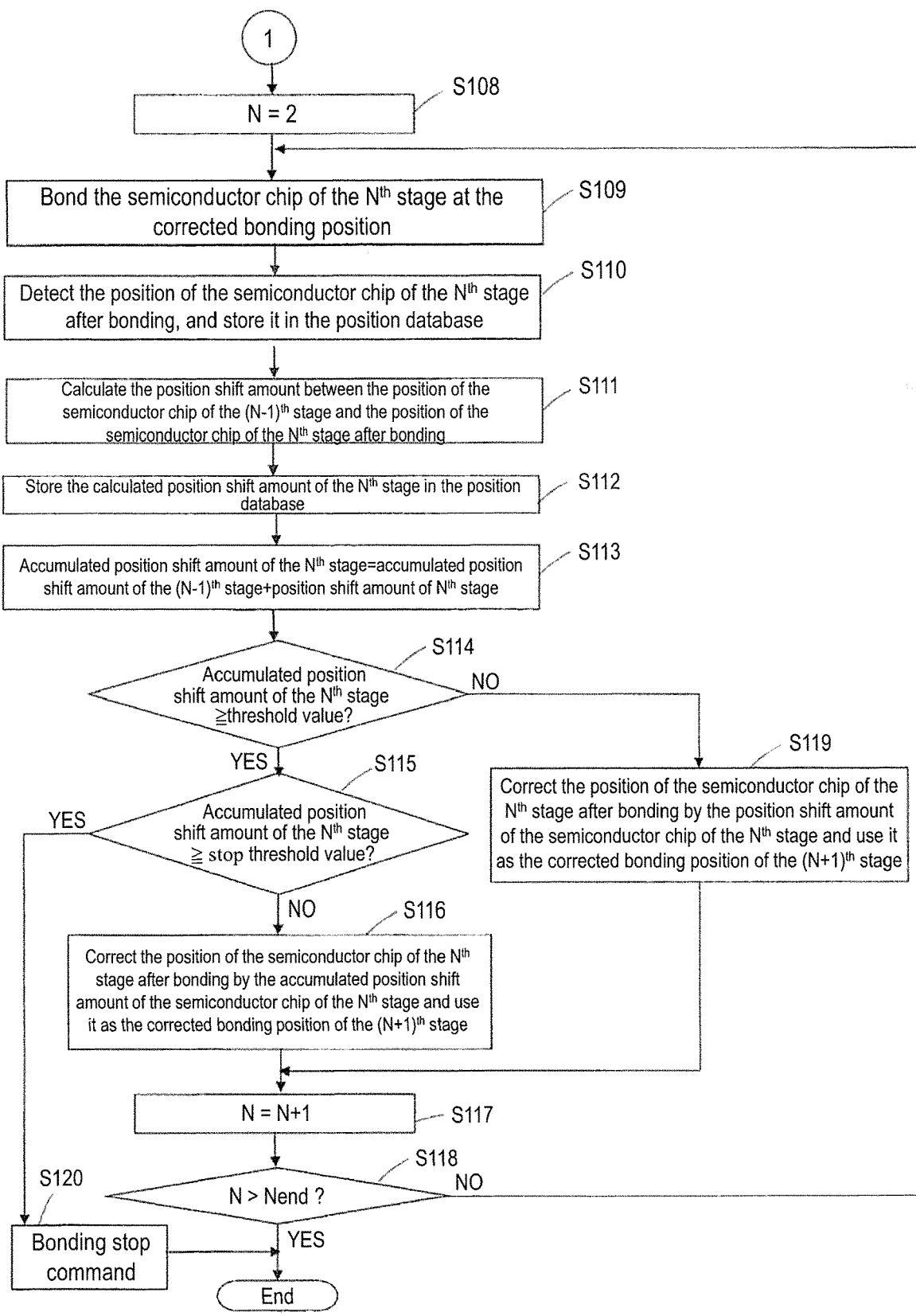
FIG. 7 is a flowchart showing an operation of the bonding apparatus shown in FIG. 1.
Figure 8:
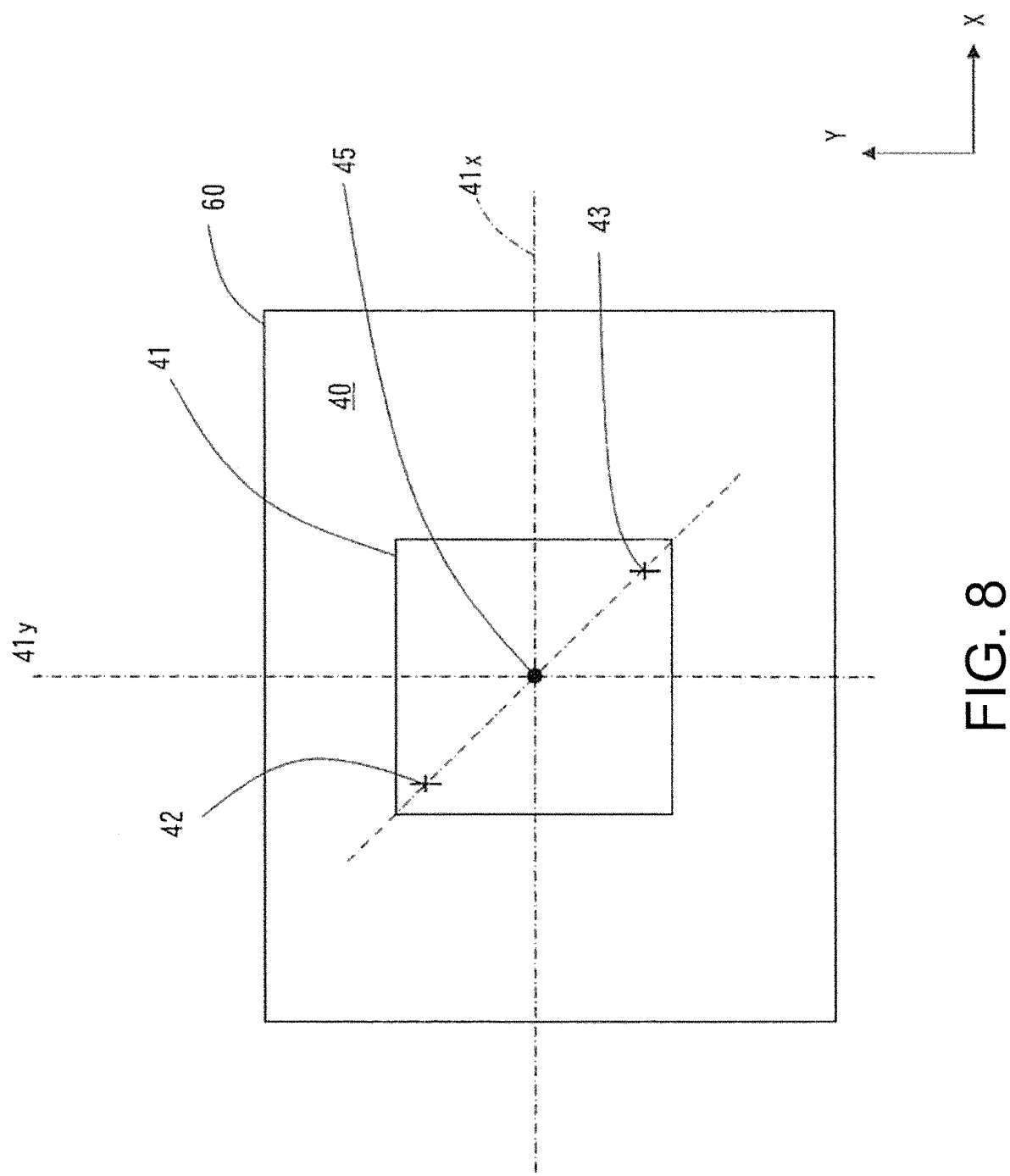
FIG. 8 is an image of an island of a substrate taken by a camera.

In step S108 of FIG. 7, the control device 50 sets a counter N to 2, and repeatedly executes steps S109 to S119 of FIG. 7 to laminate and bond the semiconductor chips 20.

Figure 10:
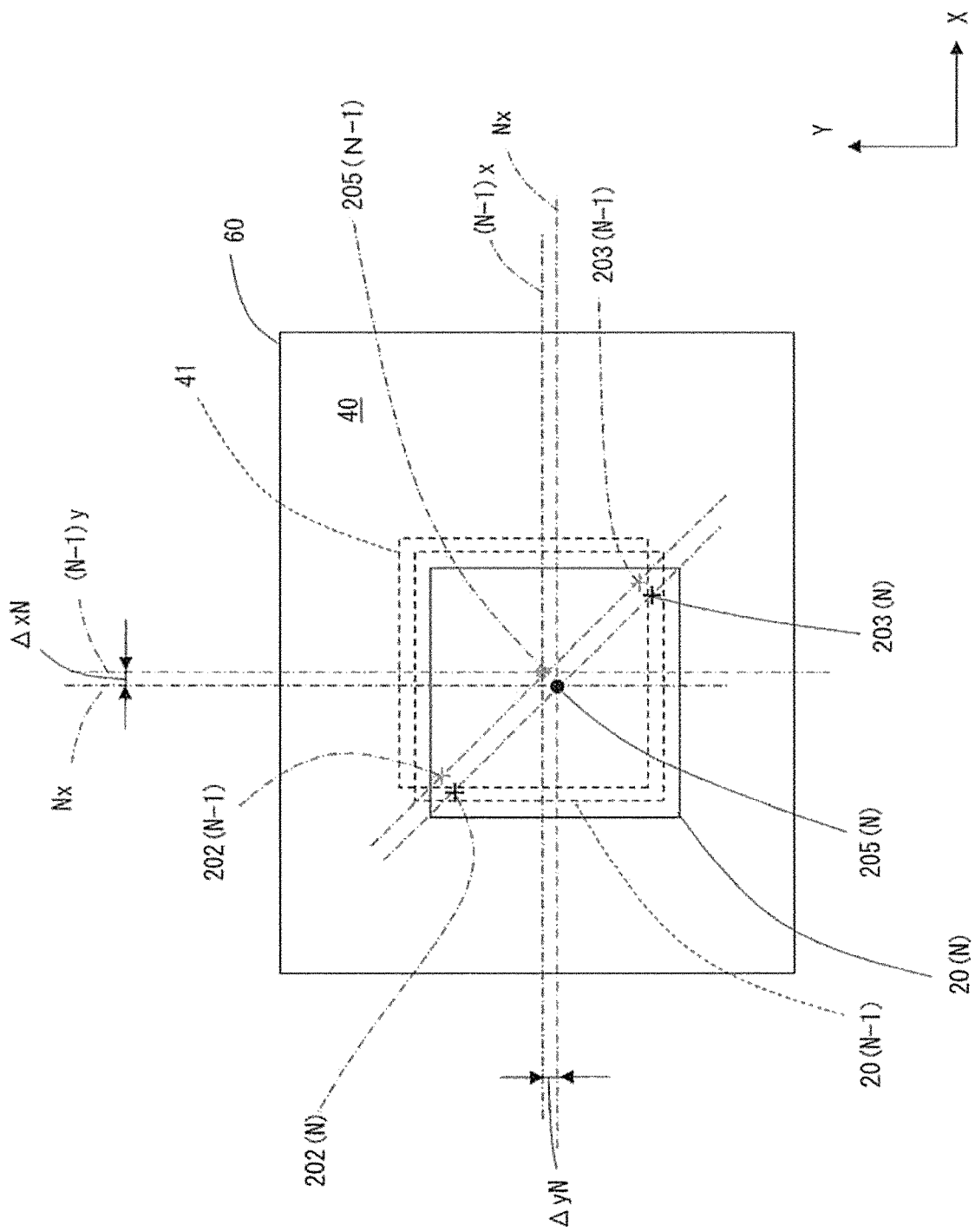
FIG. 10 is an image of a state where the semiconductor chip of the $N^{th}$ stage is laminated and bonded onto the semiconductor chip of the first stage shown in FIG. 9, taken by the camera.

In step S109 of FIG. 7, as shown in FIG. 10, the bonding control unit 58 bonds the semiconductor chip 20(N) of the $N^{th}$ stage. Then, in step S110 of FIG. 7, similar to the case of the semiconductor chip 21 of the first stage, the position detection unit 55 receives the image of the semiconductor chip 20(N) of the $N^{th}$ stage taken by the camera 13, and detects the centerline Nx in the X direction and the centerline Ny in the Y direction from the positions of two marks 202(N) and 203(N) to calculate the XY coordinates (xN, yN) of the center position 205(N). Then, the position detection unit 55 stores the calculated XY coordinates (xN, yN) in the position database 56 as shown in FIG. 5.

In step S111 of FIG. 7, the position correction unit 57 calculates the position shift amount (ΔxN, ΔyN) between the XY coordinates (xN−1, yN−1) of the center position 205 (N−1) of the semiconductor chip 20(N−1) of the N−1$^{th}$ stage and the XY coordinates (xN, yN) of the center position 205(N) of the semiconductor chip 20(N) of the N$^{th}$ stage stored in the position database 56. Then, in step S112 of FIG. 6, the position correction unit 57 stores the calculated position shift amount (ΔxN, ΔyN) of the semiconductor chip 20(N) of the N$^{th}$ stage in the position database 56 as shown in FIG. 5. Here, (ΔxN, ΔyN) is ΔxN=xN−(xN−1), and ΔyN=yN−(yN−1).

In step S113 of FIG. 7, the position correction unit 57 adds the calculated position shift amount of the semiconductor chip 20(N) of the N$^{th}$ stage to the accumulated position shift amount of the N−1$^{th}$ stage to calculate the accumulated position shift amount of the N$^{th}$ stage, and stores it in the position database 56 as shown in FIG. 5. Here, the accumulated position shift amount of the N$^{th}$ stage is $$\left(\sum_{K=1}^{N}\Delta x_K, \sum_{K=1}^{N}\Delta y_K\right).$$ [Numerical formula 3]

In step S114 of FIG. 7, the position correction unit 57 determines whether the accumulated position shift amount of the Nun stage is greater than or equal to a predetermined threshold value. When the accumulated position shift amount of the N$^{th}$ stage is less than the predetermined threshold value and it is determined as NO in step S114 of FIG. 7, the process proceeds to step S119 of FIG. 7 and the position correction unit 57 corrects the XY coordinates (xN, yN) of the center position 205 of the semiconductor chip 20(N) of the Nun stage by the position shift amount (ΔxN, ΔyN) of the semiconductor chip 20(N) of the Nun stage to output (xN+1)=xN+ΔxN, and (yN+1)=yN+ΔyN as the corrected bonding position of the semiconductor chip 20(N+1) of the N+1$^{th}$ stage to the bonding control unit 58, and the process proceeds to step S117 of FIG. 7.

In step S117 of FIG. 7, the control device 50 increases the counter N by 1, and determines whether N exceeds a total lamination number Nend in step S118 of FIG. 7. Then, when it is determined as NO in step S118 of FIG. 7, the process returns to step S109 of FIG. 7, and the semiconductor chip 20(N+1) of the N+1$^{th}$ stage is bonded.

As described above, when the accumulated position shift amount is less than the predetermined threshold value, the bonding position is corrected by the position shift amount (ΔxN, ΔyN) of the semiconductor chip 20 of each stage after the bonding of each stage to perform the bonding of the next stage. Therefore, the shift amount of the bonding of each stage can be suppressed.

On the other hand, when the number of laminated stages increases and the accumulated position shift amount becomes greater than or equal to the predetermined threshold value, and the position correction unit 57 determines it as YES in step S114 of FIG. 7, the process proceeds to step S115 of FIG. 7 and the position correction unit 57 determines whether the accumulated position shift amount of the N$^{th}$ stage is greater than or equal to a stop threshold value that is greater than the predetermined threshold value. When it is determined as NO in step S115 of FIG. 7, the process proceeds to step S116 of FIG. 7 and the position correction unit 57 corrects the XY coordinates (xN, yN) of the center position 205(N) of the semiconductor chip 20(N) of the N$^{th}$ stage by the accumulated position shift amount $$\left(\sum_{K=1}^{N}\Delta x_K, \sum_{K=1}^{N}\Delta y_K\right)$$ [Numerical formula 4]

of the semiconductor chip 20(N) of the N$^{th}$ stage, and outputs it as the corrected bonding position of the semiconductor chip 20(N+1) of the N+1$^{th}$ stage to the bonding control unit 58.

The bonding control unit 58 moves the bonding head 11 in the XY directions so that the Z-direction centerline 12z of the bonding nozzle 12 comes to the XY coordinates $$\left(xN+\sum_{K=1}^{N}\Delta x_K\right), \left(yN+\sum_{K=1}^{N}\Delta y_K\right).$$ [Numerical formula 5]

The semiconductor chip 20(n+1) of the N+1$^{th}$ stage is sucked and fixed to the tip of the bonding nozzle 12 so that the center coordinates XY become the position of the Z-direction centerline 12z. Accordingly, when the Z-direction centerline 12z of the bonding nozzle 12 is aligned with the XY coordinates $$\left(xN+\sum_{K=1}^{N}\Delta x_K\right), \left(yN+\sum_{K=1}^{N}\Delta y_K\right),$$ [Numerical formula 6]

the center position 205(N+1) of the semiconductor chip 20(N+1) becomes the same position as the center position 45 of the island 41 of the substrate 40. Then, the bonding control unit 58 lowers the bonding nozzle 12 to bond the semiconductor chip 20(N+1) of the N+1$^{th}$ stage onto the semiconductor chip 20(N). Thus, as shown in FIG. 11, the center position 205(N+1) of the semiconductor chip 20(N+1) of the N+1$^{th}$ stage can be aligned with the center position 45 of the island 41 to be bonded.

Figure 11:
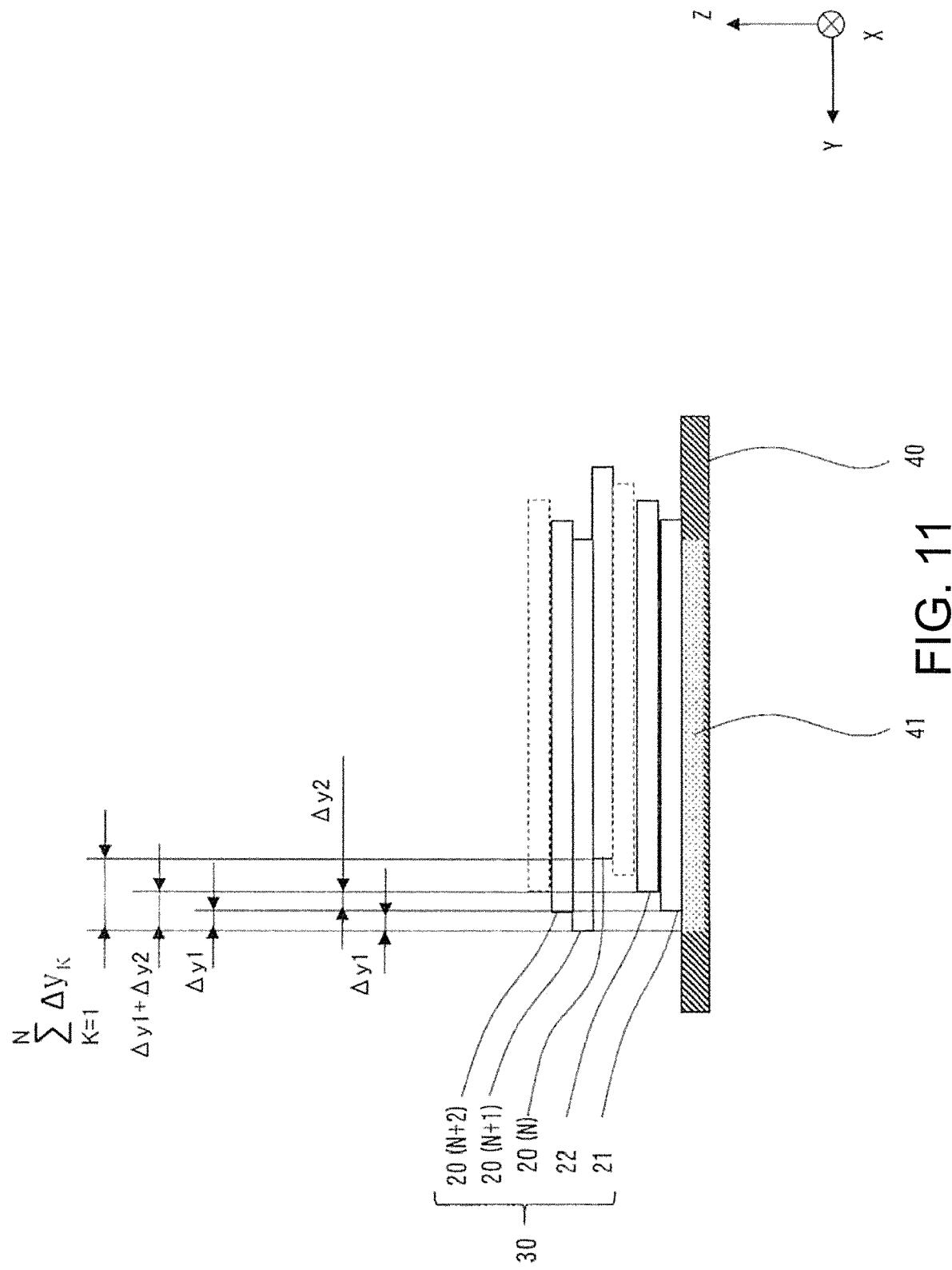
FIG. 11 is an elevation view showing the position shift of the semiconductor chip of each stage in the lateral direction in the case where an accumulated position shift amount of the semiconductor chip of the $N^{th}$ stage is greater than or equal to a predetermined threshold value when the semiconductor chips are laminated and bonded by the bonding apparatus shown in FIG. 1.

By laminating and bonding the semiconductor chips 20 as described above, even if the semiconductor chip 20 of each stage continuously shifts laterally in one direction and is laminated, as shown in FIG. 11, the semiconductor chips 20 can be prevented from exceeding the predetermined threshold value and continuously shifting laterally in one direction during lamination and bonding.

Then, in step S117 of FIG. 7, the control device 50 increases the counter N by 1, and determines whether N exceeds the total lamination number Nend in step S118 of FIG. 7. Then, when it is determined as NO in step S118 of FIG. 7, the process returns to step S109 of FIG. 7, and the semiconductor chip 20(N+1) of the N+1$^{th}$ stage is bonded.

Further, when it is determined as YES in step S118 of FIG. 7, the control device 50 ends the bonding operation.

In addition, when it is determined as YES in step S115 of FIG. 7, the process proceeds to step S120 of FIG. 7 and the position correction unit 57 outputs a bonding stop command to the bonding control unit 58. The bonding control unit 58 stops the bonding operation when the bonding stop command is input. Thus, abnormal tilt during lamination and bonding can be detected and the bonding apparatus 100 can be stopped.

As described above, when laminating and bonding the semiconductor chips 20 on the plurality of islands 41 of the substrate 40, the bonding apparatus 100 stores each position of each island 41 and each position of the semiconductor chip 20 of each stage laminated and bonded, and the position shift amount of each stage in the position database 56 for each island 41 of the substrate 40, and corrects the bonding position of each stage of the semiconductor chip 20 on each island 41 with reference to this position database 56.

Thus, even if there are variations in the direction and size of the position shift amounts depending on the islands 41, the bonding position can be appropriately corrected for each island.

Next, an operation in the case where lamination and bonding are performed up to the $M^{th}$ stage of the intermediate stage less than the total lamination number Nend and then the bonding is stopped, and the substrate 40 laminated with the semiconductor chips 20 is taken out from the bonding stage 16 for inspection, and then the substrate 40 is sucked and fixed to the bonding stage 16 again to restart the lamination and bonding from the $M+1^{th}$ stage, will be described with reference to FIG. 12 and FIG. 13.

The lamination and bonding up to the $M^{th}$ stage are performed by the operation shown in the flowcharts shown in FIG. 6 and FIG. 7. Therefore, the position of the island 41 and each position of the semiconductor chip 20 of each stage laminated and bonded from the first stage to the $M^{th}$ stage, the position shift amount of each stage, and the accumulated position shift amount of each stage from the first stage to the $M^{th}$ stage are stored in the position database 56.

Figure 12:
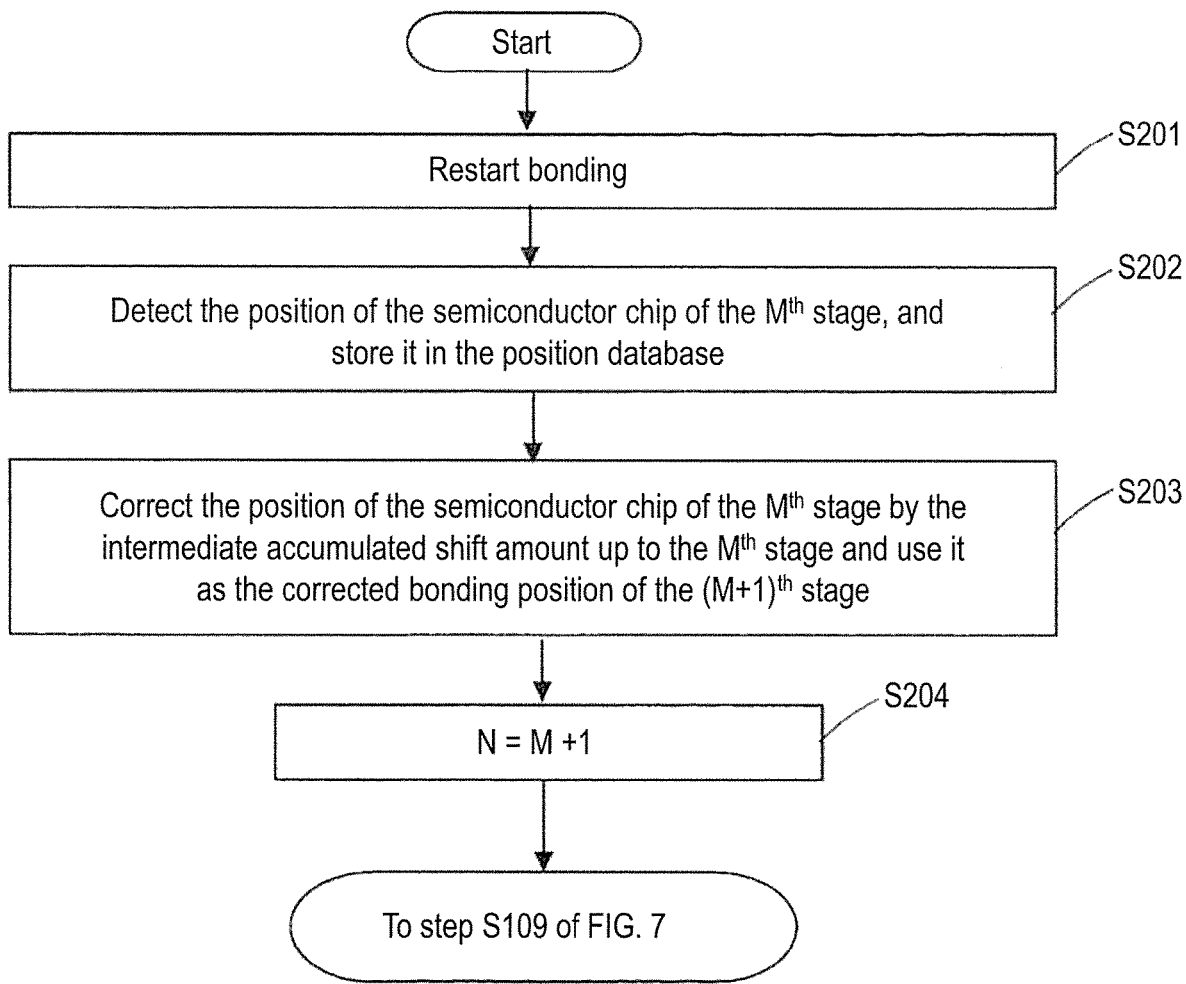
FIG. 12 is a flowchart showing an operation of the bonding apparatus shown in FIG. 1 when bonding is restarted after the bonding is stopped in an intermediate stage.

When the bonding is restarted in step S201 of FIG. 12, as shown in step S202 of FIG. 12, similar to the case of the semiconductor chip 21 of the first stage, the position detection unit 55 receives the image of the semiconductor chip 20(M) of the $M^{th}$ stage taken by the camera 13, and calculates the XY coordinates (xM, yM) of the center position 205(M) from the positions of the two marks 202(M) and 203(M). Then, the position detection unit 55 stores the calculated XY coordinates (xM, yM) in the position database 56 as shown in FIG. 5. At this time, the position detection unit 55 rewrites and updates the XY coordinates (xM, yM) of the semiconductor chip 20(M) of the $M^{th}$ stage detected in step S110 of FIG. 7 before the bonding is stopped.

As shown in step S203 of FIG. 12, the position correction unit 57 adds the intermediate accumulated position shift amount up to the $M^{th}$ stage stored in the position database 56 to the XY coordinates (xM, yM) of the semiconductor chip 20(M) of the $M^{th}$ stage to calculate the corrected bonding position of the semiconductor chip 20(M+1) of the $M+1^{th}$ stage as $$\left(xM + \sum_{K=1}^{M} \Delta x_K\right), \left(yM + \sum_{K=1}^{M} \Delta y_K\right) \quad \text{[Numerical formula 7]}$$

and output it to the bonding control unit 58.

Then, the control device 50 sets the counter N to M+1 in step S204 of FIG. 12 and the process proceeds to step S109 of FIG. 7 to perform the bonding of the semiconductor chip 20(M+1) of the $M+1^{th}$ stage.

Thereafter, the control device 50 repeatedly executes steps S109 to S119 of FIG. 7 to laminate and bond the semiconductor chips 20, and stops the bonding operation once the bonding reaches the total lamination number Nend.

As described above, when the bonding apparatus 100 performs lamination and bonding up to the $M^{th}$ stage of the intermediate stage and then restarts the lamination and bonding from the $M+1^{th}$ stage, the center position 205(M+1) of the semiconductor chip 20(M+1) of the $M+1^{th}$ stage can be aligned with the center position 45 of the island 41 for bonding. Therefore, after the bonding is stopped and the substrate 40 is taken out from above the bonding stage 16, when the substrate 40 is set again and the bonding is restarted, the state that the semiconductor chip 20 shifts laterally in one direction can be reset, and the semiconductor chip 20 can be suppressed from greatly shifting laterally after the bonding is restarted.

In addition, the position database 56 stores each position of the semiconductor chip 20 of each stage from the first stage to the $M^{th}$ stage of the semiconductor chips 20 bonded onto all the islands 41 and the position shift amount of each stage, and the accumulated position shift amount of each stage from the first stage to the $M^{th}$ stage. Therefore, even if the lamination and bonding of the $M+1^{th}$ and subsequent stages are performed by using another bonding apparatus 100 instead of the same bonding apparatus 100, the semiconductor chip 20 can be suppressed from greatly shifting laterally after the bonding is restarted.

Next, a case where the semiconductor chip 20 is bonded after test bonding is performed using dummy chips made of glass or the like in the bonding apparatus 100 will be described.

In this case, after executing step S101 of FIG. 6 to step S108 of FIG. 7, the control device 50 continuously executes steps S109 to S119 of FIG. 7 to laminate the dummy chips up to the $Nend^{th}$ stage, and store each position of each island 41 and each position of the semiconductor chip 20 of each stage laminated and bonded, the position shift amount of each stage, and the accumulated position shift amount of each stage in the position database 56 for each island 41.

Figure 13:
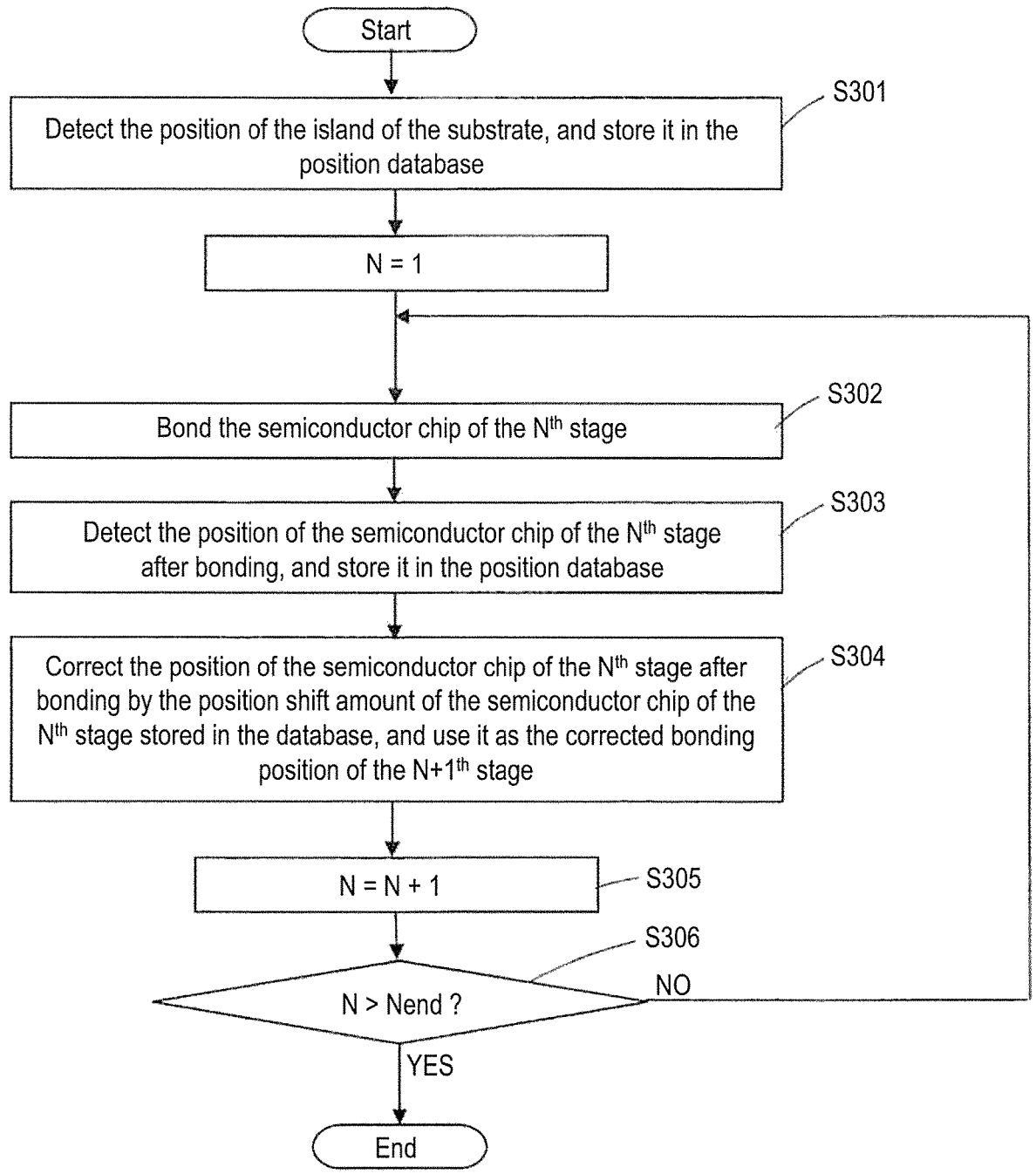
FIG. 13 is a flowchart showing an operation of the bonding apparatus in the case where lamination and bonding of the semiconductor chips are performed by using a dummy chip and using a position database that stores each position of the island and each position of the semiconductor chip of each stage laminated and bonded, the position shift amount of each stage, and the accumulated position shift amount of each stage for each island 41.

Then, when the semiconductor chips 20 are laminated and bonded, instead of calculating the position shift amount of each stage and the accumulated position shift amount of each stage, the position of the island 41 and each position of the semiconductor chip 20 of each stage may be detected as shown in steps S301 and 303 of FIG. 13, and each detected position may be corrected by the position shift amount of each stage stored in the position database 56 to be used as the corrected bonding position of the next stage for performing the lamination and bonding of each stage as in step S304 of FIG. 13.

In this case, since the position shift amount of each stage and the accumulated position shift amount of each stage are not calculated, it is possible to perform the lamination and bonding at a high speed while suppressing the semiconductor chip 20 from continuously shifting in one direction.

Furthermore, a correction amount may be obtained by test bonding using dummy chips to laminate and bond the semiconductor chips 20 and then mount them on all or some of the islands 41 and to measure the position shift amount of each stage and the position shift of accumulated position. In this case, the measured value of the lamination and bonding can be fed back to the correction amount obtained in the test bonding. As a result, it is possible to reduce the influence of distortion or the like of the stage and the gantry rail 15 caused by heat and aging, and to perform lamination and bonding with higher accuracy.

As described above, the bonding apparatus 100 of the embodiment can prevent the semiconductor chip 20 from continuously shifting laterally in one direction during lamination and bonding.

In the above description, the bonding apparatus 100 laminates and bonds the semiconductor chips 20 onto the islands 41 of the substrate 40, but the present invention is not limited thereto. The present invention can also be applied to laminate and bond the semiconductor chips 20 onto a plurality of base chips formed on a wafer.

Further, in the above description, the rail for guiding the bonding head 11 is the gantry rail 15. However, the gantry rail 15 is an example, and for example, both ends of the guide rail 17 may be fixed. In this case, it can be configured to drive the bonding head 11 in only one direction, and drive the stage in a direction orthogonal thereto. In addition, the guide rail 17 can be used even if it is not in the shape of a gantry.

What is claimed is:

1. A bonding apparatus for laminating and bonding a plurality of semiconductor chips respectively onto a plurality of bonding regions of a base member, the bonding apparatus comprising:
   a position detection unit detecting each position of each of the bonding regions of the base member and each position of the semiconductor chip of each stage laminated and bonded onto each of the bonding regions of the base member, and storing data of each position detected in a position database for each of the bonding regions of the base member;
   a position correction unit correcting a bonding position with reference to the position database, and outputting a corrected bonding position; and
   a bonding control unit performing bonding of the semiconductor chip based on the corrected bonding position input from the position correction unit,
   wherein the position correction unit:
   calculates a position shift amount between a position of each of the bonding regions of the base member and a position of the semiconductor chip bonded thereon, or a position shift amount between a position of the semiconductor chip of an $N-1^{st}$ stage and a position of the semiconductor chip of an $N^{th}$ stage bonded directly on the semiconductor chip of the $N-1^{st}$ stage, and stores each of calculated position shift amounts in the position database for each of the bonding regions of the base member,
   accumulates the position shift amounts from the base member to the semiconductor chip of the $N^{th}$ stage when laminating and bonding the semiconductor chips to obtain an accumulated position shift amount, and
   corrects the position of the semiconductor chip of the $N^{th}$ stage by the accumulated position shift amount when the accumulated position shift amount is greater than or equal to a predetermined threshold value, and outputs the position corrected as the corrected bonding position, and
   the bonding control unit performs bonding of the semiconductor chip of a next stage at the corrected bonding position input from the position correction unit.

2. The bonding apparatus according to claim 1, wherein the position correction unit corrects the position of the semiconductor chip of the $N^{th}$ stage by each position shift amount of the $N^{th}$ stage when the accumulated position shift amount is less than the predetermined threshold value, and outputs the position corrected as the bonding position of the next stage.

3. The bonding apparatus according to claim 1, wherein the position correction unit outputs a stop command for stopping a bonding operation to the bonding control unit when the accumulated position shift amount is greater than or equal to a predetermined stop threshold value, and
   the bonding control unit stops the bonding operation when the stop command is input from the position correction unit.

4. The bonding apparatus according to claim 1, wherein when bonding is stopped in a state of laminating and bonding to an intermediate stage and the base member is taken out, and then the base member is set again,
   the position correction unit accumulates each position shift amount from the base member to the semiconductor chip of the intermediate stage with reference to the position database, and calculates an intermediate accumulated position shift amount, and
   corrects each position of the semiconductor chip of the stage bonded immediately before bonding is stopped by the intermediate accumulated position shift amount calculated, and outputs the position corrected as the corrected bonding position.

5. The bonding apparatus according to claim 1, wherein a plurality of dummy chips are respectively laminated and bonded onto each of the bonding regions of the base member,
   the position detection unit detects each position of each of the bonding regions of the base member and each position of the dummy chip of each stage laminated and bonded onto each of the bonding regions of the base member, and stores data of each position detected in the position database for each of the bonding regions of the base member,
   the position correction unit calculates a position shift amount between a position of each of the bonding regions of the base member and a position of the dummy chip bonded thereon, or a position shift amount between a position of the dummy chip bonded and a position of the dummy chip bonded directly thereon, and stores each position shift amount calculated in the position database for each of the bonding regions of the base member, and
   corrects a bonding position of each stage when the semiconductor chip is laminated and bonded based on the position database.

6. A bonding method for laminating and bonding a plurality of semiconductor chips respectively onto a plurality of bonding regions of a base member, the bonding method comprising:
   a position detection step of detecting each position of each of the bonding regions of the base member and each position of the semiconductor chip of each stage laminated and bonded onto each of the bonding regions of the base member, and storing data of each position detected in a position database for each of the bonding regions of the base member;
   a position shift amount calculation step of calculating a position shift amount between a position of each of the bonding regions of the base member and a position of the semiconductor chip bonded thereon, or a position shift amount between a position of the semiconductor chip of an $N-1^{st}$ stage and a position of the semiconductor chip of an $N^{th}$ stage bonded directly on the semiconductor chip of the $N-1^{st}$ stage, and storing each of calculated position shift amounts in the position database for each of the bonding regions of the base member;

an accumulated position shift amount calculation step of accumulating the position shift amounts from the base member to the semiconductor chip of the $N^{th}$ stage when laminating and bonding the semiconductor chips to obtain an accumulated position shift amount;

a position correction step of correcting the position of the semiconductor chip of the $N^{th}$ stage by the accumulated position shift amount when the accumulated position shift amount is greater than or equal to a predetermined threshold value, and using the position corrected as a bonding position of a next stage; and a bonding step of laminating and bonding the semiconductor chip of the next stage at a corrected bonding position.

7. The bonding method according to claim 6, wherein the position correction step corrects the position of the semiconductor chip of the $N^{th}$ stage by each position shift amount of the $N^{th}$ stage calculated in the position shift amount calculation step when the accumulated position shift amount is less than the predetermined threshold value, and uses the position corrected as the bonding position of the next stage.

8. The bonding method according to claim 6, comprising a bonding stop step of stopping a bonding operation when the accumulated position shift amount is greater than or equal to a predetermined stop threshold value.

9. The bonding apparatus according to claim 2, wherein the position correction unit outputs a stop command for stopping a bonding operation to the bonding control unit when the accumulated position shift amount is greater than or equal to a predetermined stop threshold value, and the bonding control unit stops the bonding operation when the stop command is input from the position correction unit.

10. The bonding apparatus according to claim 2, wherein when bonding is stopped in a state of laminating and bonding to an intermediate stage and the base member is taken out, and then the base member is set again, the position correction unit accumulates each position shift amount from the base member to the semiconductor chip of the intermediate stage with reference to the position database, and calculates an intermediate accumulated position shift amount, and corrects each position of the semiconductor chip of the stage bonded immediately before bonding is stopped by the intermediate accumulated position shift amount calculated, and outputs the position corrected as the corrected bonding position.

11. The bonding apparatus according to claim 2, wherein a plurality of dummy chips are respectively laminated and bonded onto each of the bonding regions of the base member, the position detection unit detects each position of each of the bonding regions of the base member and each position of the dummy chip of each stage laminated and bonded onto each of the bonding regions of the base member, and stores data of each position detected in the position database for each of the bonding regions of the base member, the position correction unit calculates a position shift amount between a position of each of the bonding regions of the base member and a position of the dummy chip bonded thereon, or a position shift amount between a position of the dummy chip bonded and a position of the dummy chip bonded directly thereon, and stores each position shift amount calculated in the position database for each of the bonding regions of the base member, and corrects a bonding position of each stage when the semiconductor chip is laminated and bonded based on the position database.

12. The bonding method according to claim 7, comprising a bonding stop step of stopping a bonding operation when the accumulated position shift amount is greater than or equal to a predetermined stop threshold value.

* * * * *